United States Patent
Chan et al.

(10) Patent No.: US 7,566,631 B2
(45) Date of Patent: *Jul. 28, 2009

(54) LOW TEMPERATURE FUSION BONDING WITH HIGH SURFACE ENERGY USING A WET CHEMICAL TREATMENT

(75) Inventors: Kevin K. Chan, Staten Island, NY (US); Kathryn Wilder Guarini, Yorktown Heights, NY (US); Erin C. Jones, Corvallis, OR (US); Antonio F. Saavedra, Jr., Gainesville, FL (US); Leathen Shi, Yorktown Heights, NY (US); Dinkar V. Singh, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 464 days.

This patent is subject to a terminal disclaimer.

(21) Appl. No.: 11/411,395

(22) Filed: Apr. 26, 2006

(65) Prior Publication Data

US 2006/0194414 A1 Aug. 31, 2006

Related U.S. Application Data

(62) Division of application No. 10/334,176, filed on Dec. 30, 2002, now abandoned.

(51) Int. Cl.
  *H01L 21/30* (2006.01)
  *H01L 21/46* (2006.01)
(52) U.S. Cl. .................. 438/455; 438/459; 438/477; 257/E21.122

(58) Field of Classification Search .................. 438/455, 438/459, 476, 477; 257/E21.122, E21.567
See application file for complete search history.

(56) References Cited

U.S. PATENT DOCUMENTS

| | | | |
|---|---|---|---|
| 5,340,435 A | 8/1994 | Ito et al. | |
| 5,441,591 A | 8/1995 | Imthurn et al. | |
| 5,517,047 A | 5/1996 | Linn et al. | |
| 6,180,496 B1 * | 1/2001 | Farrens et al. | ............... 438/455 |
| 6,902,987 B1 | 6/2005 | Tong et al. | |

FOREIGN PATENT DOCUMENTS

JP 08008413 1/1996

OTHER PUBLICATIONS

Amirfeiz, P., et al. "Formation of silicon structures by plasma-activated wafer bonding", J. Electrochem. Soc., 147 (7), 2693 (2000).
Pasquariello, D., et al. "Oxidation and induced damage in oxygen plasma in-situ wafer bonding", J. Electrochem. Soc., 147 (7), 2699 Nov. 1, 2002 (2000).

(Continued)

*Primary Examiner*—Thanhha Pham
(74) *Attorney, Agent, or Firm*—Scully, Scott, Murphy & Presser, P.C.; Louis J. Percello, Esq.

(57) ABSTRACT

Described is a wet chemical surface treatment involving $NH_4OH$ that enables extremely strong direct bonding of two wafer such as semiconductors (e.g., Si) to insulators (e.g., $SiO_2$) at low temperatures (less than or equal to 400° C.). Surface energies as high as ~4835±675 $mJ/m^2$ of the bonded interface have been achieved using some of these surface treatments. This value is comparable to the values reported for significantly higher processing temperatures (less than 1000° C.). Void free bonding interfaces with excellent yield and surface energies of ~2500 $mJ/m^2$ have also be achieved herein.

1 Claim, 1 Drawing Sheet

OTHER PUBLICATIONS

Guarini, K., et al. "Electrical Integrity of State-of-the-Art 0.13 mm SOI CMOS Devices and Circuits Transferred for Three Dimensional (3D) Integrated Circuit (IC) Fabrication", International Electron Devices Meeting Technical Digest, (2002).

* cited by examiner

LOW TEMPERATURE FUSION BONDING WITH HIGH SURFACE ENERGY USING A WET CHEMICAL TREATMENT

RELATED APPLICATIONS

This application is a divisional of U.S. application Ser. No. 10/334,176, filed Dec. 30, 2002 now abandoned.

FIELD OF THE INVENTION

The present invention relates to semiconductor processing, and more particularly to fusion bonding of two wafers at low temperatures. The present invention also relates to a bonded wafer pair formed by the fusion bonding method of the present invention. The resultant bonded wafer pair is characterized as having a low void/bubble density at the bonded interface and a high surface energy.

BACKGROUND OF THE INVENTION

Wafer bonding enables the formation of non-standard material stacks that are becoming increasingly important for various high performance microelectronic device applications. As the semiconductor industry faces fundamental challenges in device scaling, there is more impetus to explore alternative materials and device structures, and the flexibility afforded by wafer bonding can potentially impact several promising new technologies.

For instance, three-dimensional (3D) integrated circuits (ICs) formed by wafer bonding will allow system designers greater possibilities for optimizing circuit performance and increasing circuit functionality; stacking different semiconductors (e.g., GaAs and Si) by wafer bonding facilitates the monolithic integration of optical and electronic devices; alternative substrates such as silicon-on-sapphire, which have high defect densities when formed by conventional heteroepitaxy, can be realized with much lower defect densities by wafer bonding and result in improved RF circuit performance; and the fabrication of novel device structures such as double-gate metal-oxide-semiconductor (DGMOS) transistors with improved performance and scalability can be aided by wafer bonding.

To achieve the requirements of the semiconductor industry for these various applications, the wafer bonding process must meet some stringent criteria. First and foremost, the bonding process must be compatible with established silicon processing, which precludes the introduction of non-standard materials and, in many cases, restricts allowable process temperatures. In addition, the wafer bonding process should exhibit: defect-free bonded interfaces, high bond strength, and scalability to large sample sizes (i.e., 200-300 mm diameter wafers). Finally, the bonding process reliability must be high to gain acceptance in manufacturing.

Wafer bonding has become virtually standard in silicon-on-insulator (SOI) substrate preparation and is used extensively for micro-electromechanical system (MEMS) device fabrication applications that tolerate high temperature processing (often greater than 1000° C.). However, many microelectronic device applications of wafer bonding (such as those in which dopant diffusion needs to be minimized, where back-end materials such as metals and low-k dielectrics are already part of the material stack, and where the wafer stack contains materials with large differences in their coefficients of thermal expansion) require that process temperatures be maintained at or below 400° C. Thus, the requirement of a low temperature bonding process that results in void and bubble free bonding interfaces with a high surface energy is crucial to realizing the full potential of wafer bonding for microelectronic applications.

Wafer bonding performed at low temperatures, however, results in bonded interfaces with low surface energies. This is a significant drawback, limiting the kinds of processing that can be performed subsequent to bonding. There have been several reports in the literature that suggest that the surface energy for low temperature bonding may be significantly enhanced by an oxygen plasma treatment of the wafer surfaces. Amirfeiz, et al. "Formation of silicon structures by plasma-activated wafer bonding", *J. Electrochem. Soc.*, 147 (7), 2693 (2000) have reported surface energies γ of approximately 1600 mJ/m$^2$ for bonding of Si/Si and γ of approximately 900 mJ/m$^2$ for bonding of SiO$_2$/SiO$_2$ following an O$_2$ plasma surface treatment and storage at room temperature. However, Amirfeiz, et al. observed severe void formation at the interface after annealing.

Similarly, D. Pasquariello et al. "Oxidation and induced damage in oxygen plasma in-situ wafer bonding", *J. Electrochem. Soc.*, 147 (7), 2699 Nov. 1, 2002 (2000) have achieved fairly high surface energies γ of approximately 1400 mJ/m$^2$ for direct bonding between Si wafers following O$_2$ plasma treatment for temperatures as low as 200° C. However, the bonded interfaces displayed voids. Thus, while plasma treatments of the wafer surfaces prior to bonding yield high surface energies for low anneal temperatures (less than 400° C.), void formation at the interfaces still appears to be a problem. Void free bonding interfaces have been demonstrated at low temperatures using wet chemical pre-treatments of the bonding surfaces, however these techniques tend to have lower surface energies, typically less than 1400 mJ/m$^2$.

In view of the drawbacks mentioned hereinabove with prior bonding processes, there is a need for providing a low temperature process for the direct bonding of wafers where the resultant bonded structure has high surface energies and contains bonding interfaces that have low defect density.

SUMMARY OF THE INVENTION

The present invention provides a method for direct bonding of two wafers wherein the bonded interfaces formed have a low dislocation density (<10$^6$ cm$^{-2}$ by cross-sectional transmission electron micrography, XTEM) and voids/bubbles covering on the order of less than about 1% of the bonded surface area. More preferably, the bonded interfaces provided by the method of the present invention are substantially void and/or bubble free, as determined by IR measurements. The bonding method of the present invention provides a substantially strong bond between the two wafers; therefore bonded wafer pairs formed from the method of the present invention can survive subsequent processing steps, e.g., wafer grinding/polishing without delamination.

Additionally, the method of the present invention provides a bonded wafer pair that is characterized as having a high surface energy on the order of about 2000 mJ/m$^2$ or greater. In some instances, a surface energy as high as 4835±675 mJ/cm$^2$ can be obtained by using the method of the present invention. In accordance with the present invention, the bonding method is performed at substantially low temperatures. The terms "substantially low temperatures" or "low temperatures" are interchangeable used in the present invention to denote a bonding temperature of less than about 400° C.

The bonding method of the present invention is fully compatible with existing semiconductor processing, therefore the method of the present invention may be integrated into various semiconductor processes. Moreover, the bonding method of the present is particularly suitable for 3D circuit integration schemes of the type described by K. Guarini et al. "Electrical Integrity of State-of-the-Art 0.13 μm SOI CMOS Devices and Circuits Transferred for Three Dimensional (3D) Integrated Circuit (IC) Fabrication", *International Electron Devices Meeting Technical Digest*, (2002), as well as for providing silicon-on-insulator (SOI) substrate materials that have a low void/bubble density interface and a high surface energy between the buried oxide region and the top Si-containing layer. Moreover, the present invention can be used to provide bonded SOI wafers on insulating substrates (e.g., quartz and sapphire), which have a large difference in the coeffiecient of thermal expansion compared to silicon.

In broad terms, the method of the present invention comprises the steps of:

providing a first wafer having a substantially out-gassed oxide layer formed on a surface thereof, said oxide layer being formed at a temperature $T_1$;

providing a second wafer having a surface;

treating the substantially out-gassed oxide layer of the first wafer and the surface of the second wafer with a solution containing $NH_4OH$;

contacting the treated surfaces with each other; and annealing the two wafers at a temperature $T_2$ which is less than or equal to $T_1$ thereby forming a bonded wafer pair which has a surface energy of about 2000 mJ/m$^2$ or greater and a bonded interface that has voids/bubbles covering less than about 1% of the bonded surface area.

The present invention also provides a bonded wafer pair, such as a silicon-on-insulator, which comprises:

an oxide layer located between a bottom wafer and a top wafer, said oxide layer having an interface with the top wafer that has a void/bubble density of less than about 1% of the bonded surface area and wherein the top wafer has a surface energy of about 2000 mJ/m$^2$ or greater.

DETAILED DESCRIPTION OF THE INVENTION

Figure 1A:
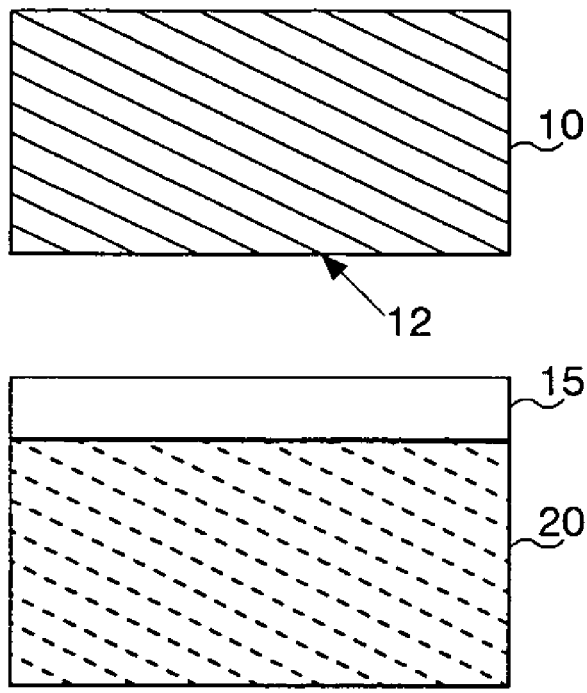
FIGS 1A-1B are pictorial representations (through cross-sectional views) showing one embodiment of the present invention; A prior to bonding; and B after bonding.

The present invention, which provides a low-temperature bonding process that results in the fabrication of a bonded wafer pair that has low void/bubble density at the bonded interface and high surface energies, will now be described in greater detail by referring to the drawings that accompany the present application.

FIG 1A shows a pair of wafers 10 and 20, respectively, which are to be subsequently bonded together utilizing the bonding method of the present invention. As shown, wafer 20 includes a substantially out-gassed oxide layer 15 formed on a surface thereof and wafer 10 includes a bare surface 12. Surface 12 may be a bare surface, as shown, or surface 12 may be a native surface oxide layer or a substantially out-gassed oxide layer.

Wafer 20 may be a semiconductor or an insulator substrate, while wafer 10 may be a semiconductor or an insulator substrate. The wafers may be composed of the same or different materials. Preferably, at least one of the wafers is a semiconductor and the other wafer is an insulating substrate; although, both wafers may be semiconductors. The term "semiconductor" as used herein denotes any semiconducting material including, but not limited to: Si, SiC, SiGe, SiGeC, Si alloys, Ge, Ge alloys, GaAs, InAs, InP as well as other III/V and II/VI compound semiconductors. The term 'semiconductor' also includes silicon-on-insulators (SOI) wherein a buried insulating material, particularly an oxide, separates a top Si-containing layer from a bottom Si-containing layer.

The term "insulating substrate" denotes a substrate material that has properties as an insulator, yet can be used as a substrate. Examples of such insulating materials include, but are not limited to: silicon oxides, silicon nitrides, sapphire, aluminum nitride, boron nitride, beryllium nitride and the like.

The term "substantially out-gassed oxide layer" is used in the present invention to denote an oxide film that contains little or no surface hydroxyl groups and/or physisorbed water. The substantially out-gassed oxide layer 15 is formed on a surface of wafer 20 by first growing or depositing an oxide film and then annealing. These processing steps, i.e., growing or depositing and annealing, are performed at a temperature $T_1$ which is typically less than about 400° C., more preferably $T_1$ is from about room temperature to about 300° C. The term "about 400° C." includes the temperature 400° C. itself.

When the oxide film is grown on the surface of the wafer, an oxidation process that is performed at $T_1$ is employed. The oxidation process includes the use of an oxygen-containing ambient including, but not limited to: pure $O_2$, air, ozone, steam and other like oxygen-containing ambients. The oxygen containing ambient may, in some embodiments, be admixed with an inert gas such as He, Ar, Xe, Kr and mixtures thereof.

When a deposition process is employed in forming the oxide film, a deposition process, which is capable of depositing an oxide film at $T_1$, is employed. Suitable deposition processes include, for example, chemical vapor deposition (CVD), low pressure CVD, plasma-enhanced CVD and other like low temperature deposition process.

Notwithstanding whether a thermal growing or deposition process is employed, the oxide film formed at this time of the present invention may have any thickness. Typically, the oxide film has a thickness of from about 10 to about 500 nm. Other thicknesses are also contemplated by the method of the present application.

An annealing step is then performed on the wafer containing the oxide film to remove excess surface hydroxyl groups and/or physisorbed water from the oxide layer. To ensure that the oxide film contains little or no surface hydroxyl groups and/or physisorbed water, this annealing step is performed at a temperature $T_1$ that is greater than or equal to the post annealing temperature $T_2$. In accordance with the present invention, both $T_1$ and $T_2$ are kept at or below 400° C. to ensure the formation of a bonded wafer pair that has extremely high surface energies and a low density of bubbles and/or voids at the bonded interface. Bubbles and voids are examples of defects that may be present at the bonded interface. This pre-annealing step, which serves to out-gas the oxide film, is performed in an inert gas or under vacuum.

After the oxide film has been pre-annealed, i.e., out-gassed, the two surfaces to be bonded, i.e., surface 12 and substantially out-gassed oxide film 15, may be optionally polished to reduce the root mean square (RMS) surface roughness to a value suitable for direct bonding. Typically, in the present invention, two surfaces are considered to be suitable for bonding when the surfaces have an RMS surface roughness of less than about 0.5 nm, with an RMS surface roughness of from about 0.1 to about 0.3 nm being more highly preferred. Any conventional polishing process such as chemical mechanical polishing (CMP) or grinding may be employed in the present invention. The polishing process may be used to thin the previously formed oxide layer from the values mentioned above.

When it is necessary to perform a polishing step, the wafers are typically cleaned after polishing to remove any particulate residue from the polished surfaces. Any conventional cleaning process that is capable of removing particulate residue formed after polishing may be employed. Specifically, cleaning may be performed utilizing a brush clean followed by either a deionized (DI) water rinse or a modified RCA clean. Typically, an RCA clean consists of an ozone rinse, followed by a Huang A ($NH_4OH:H_2O_2:H_2O$) dip, followed by a Huang B ($H_2O:HCl$) dip, with DI water rinses after each chemical treatment.

The two clean surfaces, i.e., surface 12 and oxide film 15, are then exposed to a $NH_4OH$ solution for varying lengths of time and temperature. This treatment may be performed by immersing the wafers into a $NH_4OH$ solution, dip coating, spray coating, or by brushing. The $NH_4OH$ treatment step is typically performed at about room temperature, but elevated temperatures are also contemplated herein.

While not wishing to be bound by any theory, it is believed that the wet chemical treatment involving $NH_4OH$ is extremely efficient at hydroxylating the mating surfaces of the wafers, thereby resulting in strong bonding across the bonding interface.

Following the $NH_4OH$ treatment, one of the following two drying embodiments may be employed in the present invention. In a first drying embodiment, the $NH_4OH$ treated wafers are dried in vacuum or, more preferably, in a suitable ambient, such as, for example, an inert gas, nitrogen, or a mixture thereof, prior to bringing the two wafers together. Drying can also be performed by spin drying. In a second drying embodiment, the $NH_4OH$ treated surfaces are rinsed with deionized water and then dried as indicated above.

It was been found by the applicants that the two 'drying' embodiments mentioned above provide different results. When drying only is performed, the resultant bonded wafer pair has extremely high surface energies on the order of about 4800 $mJ/m^2$. In the case of the second drying embodiment, a bonded wafer pair having slightly lower surface energies as compared to that of a bonded wafer pair prepared by drying only is obtained. Moreover, when the bonded wafer pair is formed from the second drying embodiment, a material is obtained that has a cleaner bonded interface as characterized by the presence of fewer bubbles/voids as compared to a bonded wafer pair obtained from the first drying embodiment. By varying the intensity and duration of the dionized water rinse, the characteristics of the bonded interface such as the surface energy and void/bubble density can be tailored for specific applications.

After drying, the surfaces of the two wafers which are to be bonded together, i.e., surface 12 and oxide layer 15, are brought into intimate contact with one another in an inert ambient. A slight external force may be applied to the wafers during the contact step and/or during the bonding process. The two wafers are then bonded by annealing the same in the inert ambient at a temperature $T_2$ which is less than or equal to $T_1$. Typically $T_2$ is less than about 400° C., more preferably $T_2$ is from about room temperature to about 300° C. The term "about 400° C." includes the temperature 400° C. itself. This annealing step is typically performed for 1 h. However this does not preclude shorter or longer anneals.

Figure 1B:
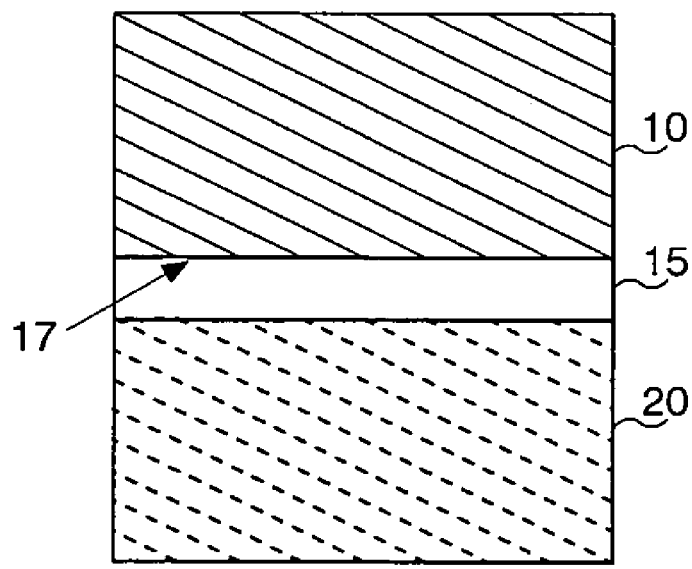

The resultant bonded wafer pair is shown, for example, in FIG. 1B. Specifically, the bonded wafer pair comprises substantially out-gassed oxide layer 15 located between bottom wafer 20 and top wafer 10. The oxide layer 15 has an interface 17 with top wafer 10 that has voids/bubbles covering less than about 1% of the bonded surface area, as determined by IR measurements. In fact for optimized bonding conditions, IR transmission images indicate no voids/bubbles at the interface. Cross-sectional transmission electron microscopy suggests that the dislocation density at the bonded interface is $<10^6$ $cm^{-2}$. Bonded interface 17 can thus be characterized as being substantially free of dislocations, bubbles and/or voids. The bonded structure obtained in the present invention has a surface energy of about 2000 $mJ/m^2$ or greater, with a surface energy as high as 4835±675 $mJ/m^2$ being possible.

In one embodiment of the present invention, the bonded wafer pair shown in FIG. 1B is a silicon-on-insulator that includes top Si wafer 10, oxide layer 15, and bottom Si wafer 20. In another embodiment of the present invention, the bonded wafer pair shown in FIG. 1B is a substrate material that includes top Si wafer 10, oxide layer 15, and bottom sapphire wafer 20.

The present invention also encompasses any device layer transfer process utilizing the bonding process mentioned hereinabove, as well as any integrated circuits, including 3-D circuits with layers of active devices fabricated using the same. The present invention describes and illustrates a low temperature process for direct bonding of a semiconductor or insulator to an oxide. This process offers advantages in obtaining bonding interfaces characterized by high surface energies, a low density of voids/bubbles and dislocations at the bonding interface.

The following example is provided to illustrate the present invention as well as some advantages obtained therefrom.

EXAMPLE

In this example, bonded wafer pairs were prepared utilizing the method of the present invention. In particular, SOI substrates were prepared by first providing two separate pairs of Si wafers. An out-gassed oxide layer was formed on one of the wafers in each pair as indicated above. The two surfaces of the wafers to be bonded in each pair were then treated with $NH_4OH$ (for 5 minutes at room temperature) and then one of the following two procedures were employed:

I. Drying the wafer surfaces in an $N_2$ ambient prior to bonding and annealing at 300° C. for 20 hours. Drying scheme I resulted in a bonded substrate having extremely high surface energies of ~4835±675 $mJ/m^2$.

II. DI (deionized) water rinse and spin dry subsequent to the $NH_4OH$ surface treatment followed by bonding and annealing at 300° C. for 20 hours. Drying scheme II resulted in a bonded substrate having slightly lower surface energies but cleaner interfaces characterized by fewer voids/bubbles. By using this drying embodiment, a substrate having void and/or bubble free bonding (as characterized by IR transmission imaging and XTEM) and bond energies as high as 2400 $mJ/m^2$ was obtained.

By tailoring the duration and intensity of the DI water rinse subsequent to the $NH_4OH$ rinse, it is possible to modify the quality of the interface as per the required application.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of bonding two wafers having a bonded surface area comprising:

providing a first wafer having a substantially out-gassed oxide layer containing no surface hydroxyl groups, physisorbed water, or a combination thereof on a surface of said first wafer, said substantially out-gassed oxide layer is formed by oxidation followed by annealing, at a temperature $T_1$, wherein $T_1$ is from about room temperature to about 300° C., providing a second wafer having a surface;

polishing said surface of said second wafer and said substantially out-gassed oxide layer of said first wafer to provide polished surfaces having a root mean square surface roughness of less than about 0.5 nm;

treating the polished substantially out-gassed oxide layer of the first wafer and the polished surface of the second wafer at room temperature with a solution containing $NH_4OH$;

contacting the treated surfaces with each other; and annealing the contacted wafers in an inert gas ambient and at a temperature $T_2$ which is less than or equal to $T_1$ and is within a range from about room temperature to about 300° C. thereby forming a bonded wafer pair which has a surface energy of about 2000 $mJ/m^2$ or greater and a bonded interface that has a dislocation density of less than $10^6$ $cm^{-2}$ and a void/bubble density of less than about 1% of the bonded surface area.

* * * * *